US006546625B1

(12) United States Patent
Le et al.

(10) Patent No.: US 6,546,625 B1
(45) Date of Patent: Apr. 15, 2003

(54) METHOD OF FORMING A CONTACT MEMBER CABLE

(75) Inventors: Ai D. Le, Sunnyvale, CA (US); John G. S. Lahlouh, San Jose, CA (US); Zhineng Fan, Santa Clara, CA (US); Matti A. Korhonen, Ithaca, NY (US); John D. Williams, Sunnyvale, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 155 days.

(21) Appl. No.: 09/799,172

(22) Filed: Mar. 6, 2001

(51) Int. Cl.[7] .......... H05K 13/00
(52) U.S. Cl. .......... 29/854; 29/857
(58) Field of Search .......... 29/828, 854, 857

(56) References Cited

U.S. PATENT DOCUMENTS 6,246,006 B1 * 6/2001 Hardin et al. .......... 174/106 R
6,384,337 B1 * 5/2002 Drum .......... 174/102 R

* cited by examiner

*Primary Examiner*—Edward K. Look
*Assistant Examiner*—Dwayne J. White
(74) *Attorney, Agent, or Firm*—Salzman & Levy

(57) ABSTRACT

The present invention provides a process for forming a contact member cable. The cable is a longer version of a contact member and can then be cut into shorter, individual contact members, to meet the particular requirements for a specific connector application. The contact members can be used as the conductive elements for a family of land grid array connectors that provide, among other things, a low profile, uniform electrical and mechanical performance, and reworkability if a contact member is damaged. The connectors are intended to interconnect electrical circuit members such as printed circuit boards, circuit modules, or the like. Such circuit members may be used in information handling system (computer) or telecommunications environments.

76 Claims, 2 Drawing Sheets

METHOD OF FORMING A CONTACT MEMBER CABLE

RELATED PATENT APPLICATIONS

This application is related to U.S. Pat. No. 6,264,476, issued to Li et al. for WIRE SEGMENT BASED INTERPOSER FOR HIGH FREQUENCY ELECTRICAL CONNECTION, which is based on application Ser. No. 09/457,776, filed Dec. 9, 1999; U.S. Pat. No. 6,312,266, issued to Fan et al. for CARRIER FOR LAND GRID ARRAY CONNECTORS, which is based on application Ser. No. 09/645,860, filed Aug. 24, 2000; and U.S. Pat. No. 6,471,525, issued to Fan et al. for SHIELDED CARRIER FOR LAND GRID ARRAY CONNECTORS AND A PROCESS FOR FABRICATING SAME, which is based on application Ser. No. 09/772,641, filed Jan. 30, 2001, all of which are hereby incorporated by reference.

FIELD OF THE INVENTION

The present invention relates to electrical connectors and, more particularly, to the process of forming cables of contact members that can later be subdivided to form individual contact members for use in connectors that interconnect electrical circuit members such as printed circuit boards, circuit modules, or the like.

BACKGROUND OF THE INVENTION

The current trend in design for connectors utilized in high speed electronic systems is to provide high electrical performance, high density and highly reliable connections between various circuit devices, which form important parts of those systems. The system may be a computer, a telecommunications network device, a handheld "personal digital assistant", medical equipment, or any other electronic equipment.

High reliability for such connections is essential due to potential end product failure, should vital misconnections of these devices occur. It is also very important that the interconnections be as dense as possible, use the least amount of real estate on the printed circuit board, and minimize impact on the printed circuit board wirability.

In some cases, such as for laptop computers and handheld devices, it is very important that the height or profile of the connectors and the auxiliary circuit members be as low as possible. Also, to assure effective repair, upgrade, and/or replacement of various components of the system (e.g., connectors, cards, chips, boards, modules, etc.), it is desirable that the connections be reworkable at the factory.

It is also highly desirable in some cases that such connections within the final product be separable and reconnectable in the field. Such a capability is also desirable during the manufacturing process for such products in order to facilitate testing, for example.

A land grid array (LGA) is an example of such a connection in which each of two primarily parallel circuit elements to be connected has a plurality of contact points, arranged in a linear or two-dimensional array. An array of interconnection elements, known as an interposer, is placed between the two arrays to be connected, and provides the electrical connection between the contact points or pads.

A family of LGA connectors is described in U.S. patent application, Ser. No. 09/457,776. Although the conductive elements of the connectors are referred to as "buttons" in that application, they are referred to as contact members in the present invention. The aforementioned patent application describes LGA connectors that provide, among other things, a low profile, uniform electrical and mechanical performance, and reworkability if a contact member is damaged. They are inexpensive to manufacture. Also, in accordance with U.S. patent application, Ser. No. 09/645,860, mechanical performance and reliability are improved through contact member retention. U.S. patent application, Serial No. 60/227,859 also discloses the fact that electrical performance is improved through shielding of the carrier.

The present invention is a process for forming a contact member cable, which is merely a longer version of a contact member. The cable can then be cut into shorter, individual contact members, to meet the particular requirements for a specific connector application.

A process that provides a cost effective method to form a contact member cable can result in a significant advancement in the art.

It is, therefore, an object of the invention to enhance the electrical connector art.

It is another object of the invention to provide a continuous process for forming a contact member cable.

It is an additional object of the invention to provide a low cost process for forming a contact member cable.

SUMMARY OF THE INVENTION

The present invention provides a process for forming a contact member cable, which is merely a longer version of a contact member. The cable can be cut into shorter, individual contact members, to meet the particular requirements for a specific connector application. The contact members are intended to be used as the conductive elements for a family of land grid array connectors that provide, among other things, a low profile, uniform electrical and mechanical performance, and reworkability if a contact member is damaged. They are inexpensive to manufacture. The connectors are intended to interconnect electrical circuit members such as printed circuit boards, circuit modules, or the like. Such connectors may be used in information handling system (computer) or telecommunications environments.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Generally speaking, the present invention provides a process for forming a contact member cable. The process allows for a continuous manufacturing flow. The cable is a longer version of a contact member that can then be cut into shorter, individual contact members, to meet the particular requirements for a specific connector application. The contact members are intended to be used as the conductive elements for a family of land grid array connectors that provide, among other things, a low profile, uniform electrical and mechanical performance, and reworkability if a contact member is damaged. The connectors are intended to interconnect electrical circuit members such as printed circuit boards, circuit modules, or the like. Such connectors may be used in information handling system (computer) or telecommunications environments.

Figure 1:
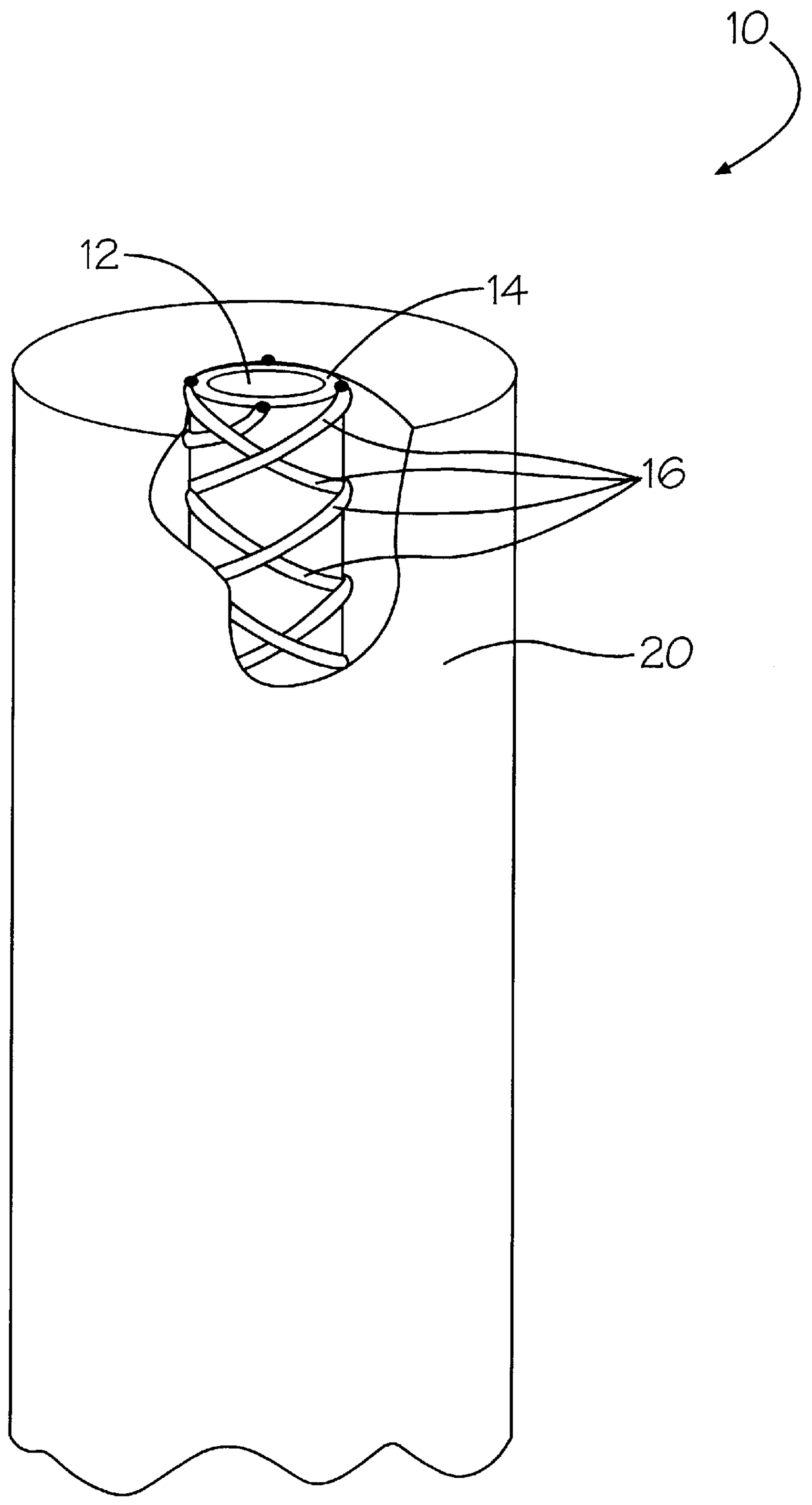
FIG. 1 is an enlarged, perspective, partially cut-away view of a portion of a contact member cable in accordance with one embodiment of the present invention.

Referring first to FIG. 1, there is shown an enlarged, perspective, partially cut-away view of a portion of a contact member cable 10 in accordance with one embodiment of the present invention. Several design considerations go into determining the materials and dimensions of the various components for making a contact member cable 10. They include determining the outer diameter of the contact member cable 10, determining the mechanical, electrical, and physical parameters for the contact members, taking into account the end-use environmental conditions, and understanding how the materials will react/interact with adjoining materials.

In this embodiment, contact member cable 10 comprises a core 12, an inner jacket 14, a plurality of conductors 16, a retention enhancing element and an outer jacket 20.

The core 12 allows a continuous manufacturing flow and a physical surface on which to form the contact member cable 10. Core 12 is preferably made of a natural or synthetic fibrous material because of its compatibility with processes such as extruding and coating. Core 12 may also be made of a polymeric or metallic material. Also, core 12 preferably adds little to the spring characteristics of the contact members (not shown). Other desirable properties for core 12 are low moisture absorbance, minimal shrinkage, lack of dyes, high tensile strength, low compression force, high melting point, relatively uniform diameter, and low tear strength, which aids in a cutting process for the later forming of individual contact members.

Inner jacket 14 combines with core 12 to provide a physical surface for conductors 16. The diameter of inner jacket 14 about the core 12 determines the coil diameter of each conductor 16. Inner jacket 14 is preferably made of a resilient polymeric material, such as a silicone-based or a saturated carbon backbone compound. Desirable properties for inner jacket 14 include low compression modulus, low compression set (e.g., less than 10 percent), minimal reversion under end-use environmental conditions over the life of the product, low tear strength, low rate of processing defects (e.g., bubbles, voids, and contaminants). and ease of material handling in manufacture. Also, it is preferable that the material chosen for inner jacket 14 be readily available, inexpensive, and have industry-wide acceptance. If a material such as a polymer is chosen for core 12, then inner jacket 14 is not required.

Conductors 16 provide a continuous, and preferably redundant, electrical path from one end of a contact member to a second end. This provides a signal, power or ground interconnection. Once subdivided into contact members, conductors 16 also act mechanically as a spring. The material for conductors 16 is chosen based on mechanical, electrical, and physical requirements. Suitable examples are copper alloys such as cadmium copper and beryllium copper, which are commonly used in the interconnection industry. Desirable properties for conductors 16 include high electrical conductivity, low bulk resistance, high yield stress, ductility, low oxidation rate, and cross sectional area appropriate for a specific application. Material for conductors 16 should be readily available, inexpensive, and should have industry-wide acceptance. The particular shape of the cross section is also application dependent.

In one example, conductors 16 consist of four 0.002-inch diameter beryllium copper wires. There are many possible configurations for orienting conductors 16 on inner jacket 14. One way is to spirally wrap them around inner jacket 14, where the wire diameter, the lay length, the spatial layout, and the wrapping configuration determine how the finished contact. member behaves mechanically, electrically, and physically. The conductors 16 can be spirally wound in the same direction, in opposing directions, or braided. Conductors 16 may be applied by many mechanisms such as ones well known in the art for wire wrapping, wire braiding, wire winding, wire twisting, wire handling, wire delivery, and wire servicing. Many other alternatives for these parameters, quantities, dimensions and materials will be readily apparent to those skilled in the art. In other embodiments conductors 16 may be implemented in other ways including as a conductive tape, for example.

Optionally, conductors 16 may be plated with at least one additional layer of conductive material (e.g., gold) to enhance performance and/or reliability.

In the preferred embodiment, retention enhancing element (not shown) is used to hold conductors 16 in place to inner jacket 14, prior to the addition of outer jacket 20. Retention enhancing element may be implemented in many ways including physical and chemical methods. In one chemical example, retention enhancing element is a material that must be chemically stable with the various components of the cable 10, must be stable under end-use environmental conditions over the life of the product, can be applied by a process such as extruding or coating, and has a viscosity high enough to flow readily. In one physical example, retention enhancing element is accomplished by applying conductors 16 on pre-grooved paths on inner jacket 14 or on a unified core 12 made of a material such as a polymer as described hereinabove.

Outer jacket 20 acts as a protective layer from the surrounding environment for the cable 10, provides additional retention enhancement for conductors 16, and provides electrical isolation of conductors 16 from shielded carriers as described in U.S. patent application, Serial No. 60/227,859. For the case with the shielded carrier, the thickness and material choice of outer jacket 20 can be used to select the electrical characteristic impedance for the contact members. The. maximum thickness of outer jacket 20 is determined by center-to-center distance between adjacent contact members.

Outer jacket 20 is preferably made of a resilient polymeric material, such as a silicone-based or a saturated carbon backbone compound. Desirable properties for outer jacket 20 include low compression modulus, low compression set (e.g., less than 10 percent), minimal reversion under end-use environmental conditions over the life of the product, low tear. strength, low rate of processing defects (e.g., bubbles, voids, and contaminants), and ease of material handling in manufacture. Also, it is preferable that the material chosen for outer jacket 20 be readily available, inexpensive, and have industry-wide acceptance.

Inner and outer jackets 14, 20 are also integral parts of the spring system of the contact members as described in U.S. patent application, Ser. No. 09/457,776.

Contact member cable 10 may be constructed in many different ways. A preferred method is to:

a) provide a core 12;

b) apply an inner jacket 14 of dielectric material to the core 12 through a process such as extrusion or coating;

c) cure the inner jacket 14 dielectric material, if necessary;

d) apply a plurality of conductive members 16 to inner jacket 14 by a means of a coil wrapping mechanism;

e) apply a retention enhancing element to conductive members 16 and inner jacket 14 to retain the location of the conductive members 16;

f) apply outer jacket 20 of dielectric material to retention enhancing element by a process such as extrusion or coating; and g) cure outer jacket 20, if necessary.

One possible extension to the aforementioned process is to apply retention enhancing element to inner jacket 14 prior to applying the conductive members 16, in order to better retain the relative positioning of the conductive members 16. Furthermore, it is possible to eliminate the need for any retention enhancing element if the material for inner jacket 14 and/or outer jacket 20 is impregnated with a similar element or if conductive members 16 are pretreated prior to wrapping.

Figure 2B:
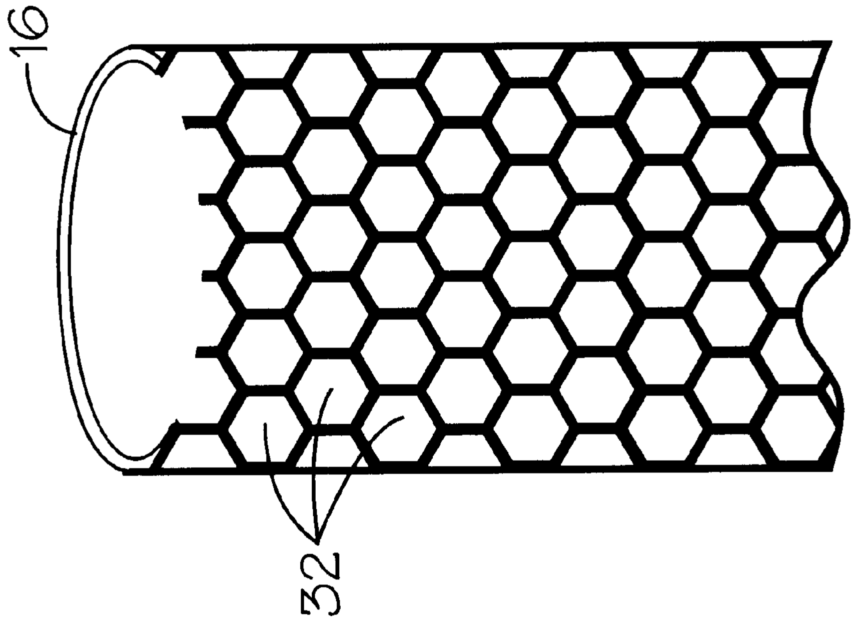
FIGS. 2*a* and 2*b* are enlarged, perspective, partially cut-away views of a portion of a contact member cable in accordance with a second embodiment of the present invention.
Figure 2A:
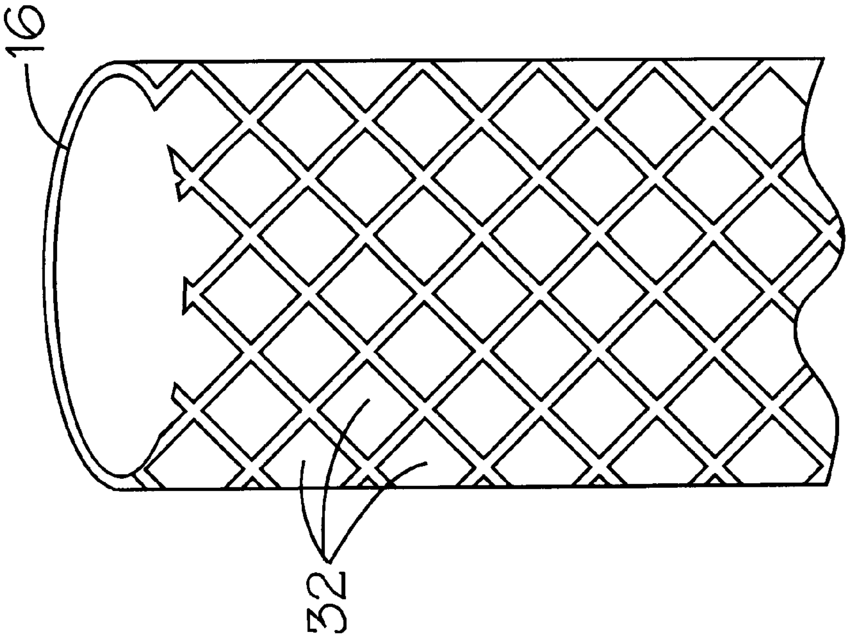

Referring now to FIGS. 2*a* and 2*b*, there are shown enlarged, perspective, partially cut-away views of a portion of a contact member cable 30 in accordance with a second embodiment of the present invention. An alternate method of implementing conductors 16 is to metallize the surface of either a core 12 of a unified material such as a polymer, or a core 12/inner jacket 14 combination, as described in the first embodiment, by a process such as sputtering or plating to form a continuous conductive tube-like structure. The surface of this conductive structure is selectively etched, preferably with a pattern of perforations or openings 32, such as in the shape of diamonds, circles, squares, triangles, and honeycombs to form conductors 16. Another method is to selectively metallize the surface of either a core 12 of a unified material such as a polymer, or a core 12/inner jacket 14 combination, as described in the first embodiment so that the additional etching step is not required. Openings 32 impart spring properties to conductors 16 and thereby to the individual contact members. An outer jacket 20 may then be formed on conductors 16. This process results in a cost saving due to the reduced number and simplification of processing steps. A further extension and simplification to this embodiment is to start with a metal tube-like structure with a perforated pattern and to dip coat it to form the core/inner jacket and outer jacket simultaneously.

Since other modifications and changes varied to fit particular operating requirements and environments will be apparent to those skilled in the art, this invention is not considered limited to the examples chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A method of forming a contact member cable, the steps comprising:

a) providing an insulative elongated core;

b) applying a first dielectric layer to substantially surround said core;

c) applying a plurality of conductive members to said first dielectric layer;

d) applying a first retention enhancing element to said first dielectric layer and said plurality of conductive members; and e) applying a second dielectric layer to said first retention enhancing element.

2. The method according to claim 1, wherein said elongated core comprises a fibrous material.

3. The method according to claim 1, wherein said step (b) applying a first dielectric layer further comprises the substep of curing said first dielectric layer.

4. The method according to claim 1, wherein said step (b) applying a first dielectric layer is performed by a process selected from the group consisting essentially of extruding and coating.

5. The method according to claim 1, wherein said step (d) applying a first retention enhancing element is performed by a process selected from the group consisting essentially of extruding and coating.

6. The method according to claim 1, wherein said step (e) applying a second dielectric layer further comprises the substep of curing said second dielectric layer.

7. The method according to claim 1, wherein said step (e) applying a second dielectric layer is performed by a process selected from the group consisting essentially of extruding and coating.

8. The method according to claim 1, the steps further comprising applying a second retention enhancing element to said first dielectric layer, after performing said step (b).

9. The method according to claim 1, wherein said first dielectric layer comprises a resilient polymeric material.

10. The method according to claim 9, wherein said resilient polymeric material is a silicone-based compound.

11. The method according to claim 9, wherein said resilient polymeric material is a saturated carbon backbone compound.

12. The method according to claim 1, wherein said step (c) applying a plurality of conductive members is performed by a mechanism selected from the group consisting of wire wrappers, wire braiders, wire winders, wire twisters, wire handlers, wire delivery devices, and wire servicers.

13. The method according to claim 8, wherein said plurality of conductive members is applied by a process selected from the group consisting essentially of spirally wrapping said plurality of conductive members in the same direction, spirally wrapping said plurality of conductive members in opposite directions, and braiding said plurality of conductive members.

14. The method according to claim 1, wherein said plurality of conductive members comprises a metallic material.

15. The method according to claim 14, wherein said metallic material is a copper-based alloy.

16. The method according to claim 14, wherein said plurality of conductive members is configured as an open tube.

17. The method according to claim 16, wherein said open tube comprises perforations.

18. The method according to claim 1, wherein said plurality of conductive members further comprises at least one plating layer.

19. The method according to claim 14, wherein said plating layer is gold.

20. The method according to claim 1, wherein said second dielectric layer comprises a resilient polymeric material.

21. The method according to claim 20, wherein said resilient polymeric material is a silicone-based compound.

22. The method according to claim 20, wherein said resilient polymeric material is a saturated carbon backbone compound.

23. A method of forming a contact member cable, the steps comprising:

a) providing an insulative elongated core;

b) applying a first dielectric layer to substantially surround said core, said first dielectric layer comprising a retention enhancing element;

c) applying a plurality of conductive members to said first dielectric layer; and d) applying a second dielectric layer to said first dielectric layer and said plurality of conductive members.

24. The method according to claim 23, wherein said elongated core comprises a fibrous material.

25. The method according to claim 23, wherein said step (b) applying a first dielectric layer further comprises the substep of curing said first dielectric layer.

26. The method according to claim 23, wherein said step (b) applying a first dielectric layer is performed by a process selected from the group consisting essentially of extruding and coating.

27. The method according to claim 23, wherein said step (d) applying a second dielectric layer further comprises the substep of curing said second dielectric layer.

28. The method according to claim 23, wherein said step (d) applying a second dielectric layer is performed by a process selected from the group consisting essentially of extrusion and coating.

29. The method according to claim 23, wherein said second dielectric layer further comprises a retention enhancing element.

30. The method according to claim 23, wherein said first dielectric layer further comprises a resilient polymeric material.

31. The method according to claim 30, wherein said resilient polymeric material is a silicone-based compound.

32. The method according to claim 30, wherein said resilient polymeric material is a saturated carbon backbone compound.

33. The method according to claim 23, wherein said step (c) applying a plurality of conductive members is performed by a mechanism selected from the group consisting of wire wrappers, wire braiders, wire winders, wire twisters, wire handlers, wire delivery devices, and wire servicers.

34. The method according to claim 33, wherein said plurality of conductive members is applied by a process selected from the group consisting essentially of spirally wrapping said plurality of conductive members in the same direction, spirally wrapping said plurality of conductive members in opposite directions, and braiding said plurality of conductive members.

35. The method according to claim 23, wherein said plurality of conductive members comprises a metallic material.

36. The method according to claim 35, wherein said metallic material is a copper-based alloy.

37. The method according to claim 23 wherein said plurality of conductive members further comprises at least one plating layer.

38. The method according to claim 37, wherein said plating layer is gold.

39. The method according to claim 23, wherein said second dielectric layer comprises a resilient polymeric material.

40. The method according to claim 38, wherein said resilient polymeric material is a silicone-based compound.

41. The method according to claim 38, wherein said resilient polymeric material is a saturated carbon backbone compound.

42. A method of forming a contact member cable, the steps comprising:

a) providing a core;

b) applying a first dielectric layer to substantially surround said core;

c) applying a plurality of conductive members pretreated with a retention enhancing element to said first dielectric layer; and d) applying a second dielectric layer to said first dielectric layer and said plurality of conductive members.

43. The method according to claim 42, wherein said elongated core comprises a fibrous material.

44. The method according to claim 42, wherein said step (b) applying a first dielectric layer further comprises the substep of curing said first dielectric layer.

45. The method according to claim 42, wherein said step (b) applying a first dielectric layer is performed by a process selected from the group consisting essentially of extruding and coating.

46. The method according to claim 42, wherein said step (d) applying a second dielectric layer further comprises the substep of curing said second dielectric layer.

47. The method according to claim 42, wherein said step (d) applying a second dielectric layer is performed by a process selected from the group consisting essentially of extruding and coating.

48. The method according to claim 42, wherein said second dielectric layer comprises a resilient polymeric material.

49. The method according to claim 48, wherein said resilient polymeric material is a silicone-based compound.

50. The method according to claim 48, wherein said resilient polymeric material is a saturated carbon backbone compound.

51. The method according to claim 42, wherein said first dielectric layer comprises a resilient polymeric material.

52. The method according to claim 51, wherein said resilient polymeric material is a silicone-based compound.

53. The method according to claim 51, wherein said resilient polymeric material is a saturated carbon backbone compound.

54. The method according to claim 42, wherein said step (c) applying a plurality of conductive members is performed by a mechanism selected from the group consisting of wire wrappers, wire braiders, wire winders, wire twisters, wire handlers, wire delivery devices, and wire servicers.

55. The method according to claim 54, wherein said plurality of conductive members is applied by a process selected from the group consisting essentially of spirally wrapping said plurality of conductive members in the same direction, spirally wrapping said plurality of conductive members in opposite directions, and braiding said plurality of conductive members.

56. The method according to claim 42, wherein said plurality of conductive members comprises a metallic material.

57. The method according to claim 56, wherein said metallic material is a copper-based alloy.

58. The method according to claim 42, wherein said plurality of conductive members comprises at least one plating layer.

59. The method according to claim 53, wherein said plating layer is gold.

60. A method of forming a contact member cable, the steps comprising:

a) providing an insulative elongated core;

b) applying a plurality of conductive members to said core; and c) applying a dielectric layer to substantially surround said conductive members and said core.

61. The method according to claim 60, wherein said elongated core comprises a polymeric material.

62. The method according to claim 60, the steps further comprising applying a first retention enhancing element to said elongated core after said providing step (a).

63. The method according to claim 60, the steps further comprising applying a second retention enhancing element to said conductive members and said elongated core after said applying step (b).

64. The method according to claim 60, wherein said step (c) applying a dielectric layer is performed by a process selected from the group consisting essentially of extruding and coating.

65. The method according to claim 60, wherein said step (c) applying a dielectric layer further comprises the substep of curing said dielectric layer.

66. The method according to claim 60, wherein said step (b) applying a plurality of conductive members is performed by a mechanism selected from the group consisting of wire wrappers, wire braiders, wire winders, wire twisters, wire handlers, wire delivery devices, and wire servicers.

67. The method according to claim 66, wherein said plurality of conductive members is applied by a process selected from the group consisting essentially of spirally wrapping said plurality of conductive members in the same direction, spirally wrapping said plurality of conductive members in opposite directions, and braiding said plurality of conductive members.

68. The method according to claim 60, wherein said plurality of conductive members comprises a metallic material.

69. The method according to claim 68, wherein said metallic material is a copper-based alloy.

70. The method according to claim 68, wherein said plurality of conductive members is configured as an open tube.

71. The method according to claim 70, wherein said open tube comprises perforations.

72. The method according to claim 60, wherein said plurality of conductive members further comprises at least one plating layer.

73. The method according to claim 72, wherein said plating layer is gold.

74. The method according to claim 60, wherein said dielectric layer comprises a resilient polymeric material.

75. The method according to claim 74, wherein said resilient polymeric material is a silicone-based compound.

76. The method according to claim 74, wherein said resilient polymeric material is a saturated carbon backbone compound.

* * * * *